(12) United States Patent
Kubo

(10) Patent No.: US 6,593,519 B2
(45) Date of Patent: Jul. 15, 2003

(54) INFRARED SENSOR

(75) Inventor: Ryuichi Kubo, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/911,310

(22) Filed: Jul. 23, 2001

(65) Prior Publication Data

US 2002/0066477 A1 Jun. 6, 2002

(30) Foreign Application Priority Data

Jul. 24, 2000 (JP) .......................... 2000-222852

(51) Int. Cl.⁷ .............. H01L 35/28; H01L 35/08
(52) U.S. Cl. ...................... 136/224; 136/237
(58) Field of Search .................. 136/224, 225, 136/227, 237; 250/338.1

(56) References Cited

FOREIGN PATENT DOCUMENTS

| JP | 05-090646 | * | 4/1993 |
|---|---|---|---|
| JP | 2526247 | | 6/1996 |
| JP | 10-318842 A | | 10/1998 |
| JP | 11-118597 A | | 4/1999 |

* cited by examiner

*Primary Examiner*—Patrick Ryan
*Assistant Examiner*—Thomas H. Parsons
(74) *Attorney, Agent, or Firm*—Keating & Bennett, LLP

(57) ABSTRACT

An infrared sensor is provided with a thermopile formed with a plurality of thermocouples connected to each other. The thermopile includes hot junctions, cold junctions, and thermoelectric patterns. The thermoelectric patterns are made of thermoelectric materials differing from each other. The hot junctions and the cold junctions are made of a bonding material which differs from the thermoelectric materials. A temperature-compensation resistor film is formed at a corner of the surface of a substrate on which the thermopile is formed, the temperature-compensation resistor film being made of the same material as the bonding material used for the hot junctions and the cold junctions.

3 Claims, 1 Drawing Sheet

INFRARED SENSOR

BACKGROUND OF THE INVENTION

1. Field of the Invention

The present invention relates to infrared sensors, in particular, to a thermopile-type infrared sensor.

2. Description of the Related Art

A known thermopile type infrared sensor is disclosed in, for example, Japanese Unexamined Patent Application Publication No. 63-318175. This infrared sensor is provided with a temperature-sensing resistor film at a corner of a substrate, for measuring and compensating for temperature of the cold junction of a thermopile so as to improve the accuracy of the infrared sensor. The temperature-sensing resistor film is made of a material such as bismuth (Bi) or antimony (Sb) which is the same thermoelectric material as used in thermocouples.

However, since Bi or Sb is a low-melting-point semimetal, it is difficult to perform deposition of the temperature-sensing resistor film without variations in the properties of the films between products. Variations over time due to moisture absorption and heat history are significant; therefore, Bi or Sb is not ideal as a material for a resistor film for temperature compensation. Moreover, since a Bi or Sb film does not adhere well to a substrate, another material must be used for an electrode for extracting sensor signals.

SUMMARY OF THE INVENTION

Accordingly, it is an object of the present invention to provide an infrared sensor having superior sensitivity which is provided with a temperature-compensation resistor film which has high reproducibility, the quality of which is not significantly deteriorated over time.

According to the present invention, a thermopile-type infrared sensor comprises a thermocouple made of thermoelectric materials which are different from each other, the thermoelectric materials being connected to each other by a bonding material which is different from the thermoelectric materials, and a substrate provided with the thermopile formed thereon, wherein a temperature-compensation resistor film made of the same material as the bonding material is provided on the substrate.

The thermopile-type infrared sensor according to the present invention may further comprise electrodes for extracting sensor outputs, which are made of the same material as the bonding material.

The bonding material may include one material selected from the group consisting of platinum, tungsten, palladium, nickel, and chromium.

By using a bonding material, which differs from the thermoelectric materials forming the thermocouple of the thermopile in the infrared sensor, for junctions between the thermoelectric materials, the quality of the electrical junction can be improved, and diffusion or the like of the materials can be avoided. By using the bonding material for the temperature-compensation resistor film, the junctions of the thermocouple and the temperature-compensation resistor film can be made simultaneously without additional processes which are required in the known method. The deposition of a film can be easily performed by using the bonding material which is not likely to vary in quality over time, whereby the accuracy in compensation for temperature is improved and an infrared sensor having superior sensitivity is obtainable by using the temperature-compensation resistor film formed by the bonding material.

According to the present invention, the temperature of cold junctions of a thermopile can be stably and accurately measured, whereby a thermopile infrared sensor having superior sensitivity can be provided at low manufacturing costs.

The above object, further objects, features, and advantages of the present invention will become apparent from the following description of the preferred embodiments with reference to the attached drawing.

DESCRIPTION OF THE PREFERRED EMBODIMENTS

Figure 1:
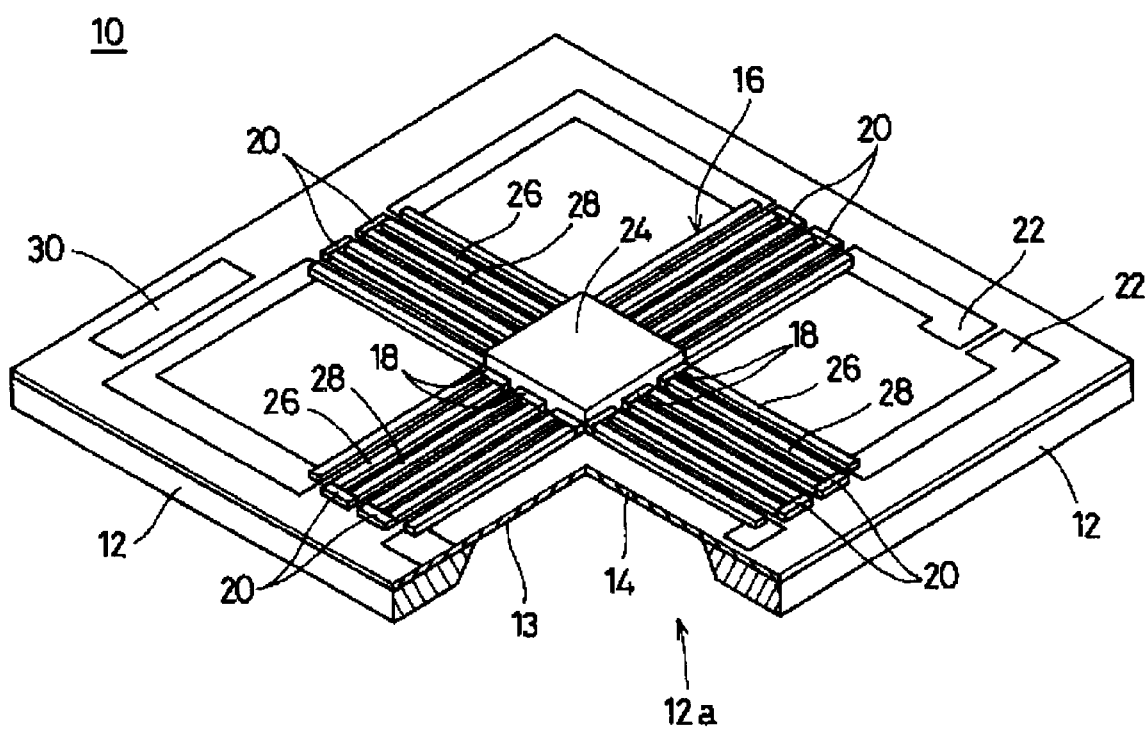
FIG. 1 is a perspective view of an infrared sensor according to an embodiment of the present invention, a pert of which is cut away.

FIG. 1 is a perspective view of an infrared sensor according to an embodiment of the present invention, a part of which is cut away.

An infrared sensor 10 shown in FIG. 1 is a thin-film thermopile device. The infrared sensor 10 includes a substrate 12 made of, for example, silicon (Si). An insulative film 13 made of, for example, silicon nitride or silicon oxide is deposited on the overall surface of the substrate 12. A cavity 12a in a rectangle in plan view is formed substantially at a central part of the substrate 12. A diaphragm 14 is formed with the insulative 13 which covers the cavity 12a.

The infrared sensor 10 is provided with, for example, a thermopile 16 formed with a plurality of thermocouples connected in series or in parallel to each other. Each thermocouple includes a hot junction 18, a cold junction 20, and thermoelectric patterns 26 and 28. The thermoelectric patterns 26 and 28 are made of materials differing from each other. The thermoelectric materials may be selected from materials generally used, such as polycrystalline silicon, indium-antimony, antimony, and bismuth.

The hot junction 18 and the cold junction 20 are respectively formed at junctions between the thermoelectric patterns 26 and 28. The hot junctions 18 are formed on the diaphragm 14, and the cold junctions 20 are formed on the substrate 12 disposed around the diaphragm 14. The material for the hot junctions 18 and the cold junctions 20 is selected from bonding materials such as platinum, tungsten, palladium, nickel, and chromium.

Sensor-output-extracting electrodes 22 connected to the ends of the thermopile 16 are formed on the substrate 12 disposed around the diaphragm 14. The sensor-output-extracting electrodes 22 are made of the same material as that for the hot junctions 18 and the cold junctions 20.

A temperature compensation resistor film 30 is formed at a corner of the surface of the substrate 12 on which the thermopile 16 is formed, the temperature-compensation resistor film 30 being made of the same material as that for the hot junction 18 and the cold junction 20. The temperature-compensation resistor film 30 is provided with a comb-shaped electrode which serves as a thin-film thermistor for measuring and compensating for the temperature at the corner of the substrate 12. The substrate 12 has a large thermal capacity and conductivity at the corner thereof compared with the diaphragm 14, whereby the temperature of the substrate 12 in the vicinity of the cold junctions 20 can be measured and be outputted by the thin-film thermistor as a resistance value. Therefore, the amount of incident infrared light can be exactly measured, whereby the temperature of an object can be accurately measured.

An infrared-absorptive film 24 in a rectangle in plan view is deposited on the diaphragm 14, the infrared-absorptive film 24 being made of, for example, nickel-chromium, gold black, and titanium oxide. The infrared-absorptive film 24 is provided for absorbing infrared light incident to the infrared sensor 10 and effectively increasing the temperature of the diaphragm 14.

The temperature-compensation resistor film 30 used in the infrared sensor 10 according to the present embodiment is easily reproducible and is not likely to vary due to moisture absorption and heat history over time because the temperature-compensation resistor film 30 is made of a bonding material. Therefore, the accuracy in temperature compensation is improved, whereby the sensitivity of the infrared sensor 10 is improved.

Since the hot junctions 18, the cold junctions 20, the temperature-compensation resistor film 30, and the extracting electrodes 22 are made of the same bonding material, manufacturing processes can be reduced compared with a known manufacturing method, whereby rationalization in the manufacture and reduction in manufacturing costs can be advanced.

What is claimed is:

1. An infrared sensor comprising:

a thermocouple made of thermoelectric materials which are different from each other, said thermoelectric materials being connected to each other by a bonding material which is different from the thermoelectric materials; and a substrate provided with the thermocouple formed thereon, wherein a temperature compensation resistor film made of the same material as said bonding material is provided on the substrate.

2. An infrared sensor according to claim 1, further comprising:

electrodes for extracting sensor outputs, the electrodes being made of the same material as said bonding material.

3. An infrared sensor according to claim 1 or 2, wherein said bonding material includes one material selected from the group consisting of platinum, tungsten, palladium, nickel, and chromium.

\* \* \* \* \*